United States Patent
Suzuki et al.

(10) Patent No.: US 8,110,780 B2
(45) Date of Patent: Feb. 7, 2012

(54) PHOTOIRRADIATION TYPE HEAT TREATMENT APPARATUS

(75) Inventors: Shinji Suzuki, Tokyo-to (JP); Akinobu Nakashima, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 639 days.

(21) Appl. No.: 12/205,014

(22) Filed: Sep. 5, 2008

(65) Prior Publication Data
US 2009/0078693 A1 Mar. 26, 2009

(30) Foreign Application Priority Data
Sep. 26, 2007 (JP) ................. 2007-248747

(51) Int. Cl.
*A21B 1/00* (2006.01)
*C23C 16/00* (2006.01)

(52) U.S. Cl. ........ 219/405; 219/390; 219/411; 118/724; 118/725; 118/50.1; 392/416; 392/418

(58) Field of Classification Search .................. 219/390, 219/405, 411; 392/416, 418; 118/724, 725, 118/50.1
See application file for complete search history.

(56) References Cited

U.S. PATENT DOCUMENTS
6,414,279 B1 7/2002 Suzuki et al.
7,045,746 B2 * 5/2006 Devine et al. ................. 219/411

* cited by examiner

*Primary Examiner* — Shawntina Fuqua
(74) *Attorney, Agent, or Firm* — Roberts Mlotkowski Safran & Cole, P.C.; David S. Safran

(57) ABSTRACT

To provide a photo-irradiation type heat treatment apparatus that eliminates the adverse influence of a light transmitting window on the temperature distribution of an article to be treated without losing the original function of a reflecting mirror a photo-irradiation type heat treatment apparatus in which heat treating of an article is performed by irradiating the article with light emitted from multiple filament lamps through a light transmitting window, by providing the apparatus with a reflecting mirror having an opening at its central area so that cooling air can pass therethrough and by providing an air permeable reflector so as to cover the opening in the reflecting mirror.

3 Claims, 5 Drawing Sheets

(A)

(B)

(C)

PHOTOIRRADIATION TYPE HEAT TREATMENT APPARATUS

BACKGROUND OF THE INVENTION

1. Field of Invention

The present invention relates to a photo-irradiation type heat treatment apparatus and specifically to a photo-irradiation type heat treatment apparatus provided with filament lamps as a light source for heating an article to be treated.

2. Description of Related Art

In various processes of semiconductor production, such as film formation, oxidation, azotization, film stabilization, crystallization and implanted ion activation, a method of heat treatment by irradiating light from a light source has recently been used. Specifically, the rapid thermal processing (RTP as used herein) used for rapidly increasing or decreasing the temperature of an article to be treated, such as semiconductor wafers, is very popular since it can enhance yield and quality.

In such a photo-irradiation type heat treatment apparatus, incandescent lamps are used as a light source, for example.

Incandescent lamps are provided with filaments inside a bulb made of a light transmissive material, radiate not less than 90% of input power and can heat an article to be treated without contacting it. Therefore, if they are used as a light source for heating glass substrates and semiconductor wafers, incandescent lamps can rapidly increase or decrease the temperature of an article as compared with a resistance heating method. More specifically, they can increase the temperature of an article up to at least 1000° C. within several seconds to several tens of seconds and the article rapidly cools after irradiation is stopped.

As shown in FIG. 11, a conventional photo-irradiation type heat treatment apparatus is provided with a chamber 41 formed by dividing its inner space into an upper space (lamp unit accommodating space S1) and a lower space (heat treatment space S2) by a plate-like light transmitting window 42. The lamp unit accommodating space S1 comprises a lamp unit 50 constituted of multiple filament lamps 51 arranged in such a way as to constitute a planar array light source and a reflecting mirror 52 is arranged above the filament lamps 51 in such a way as to reflect light emitted upward from the filament lamps 51 back toward an article W to be treated, whereby light emitted from each filament lamp 51 is directly, or after being reflected by the reflecting mirror 52, delivered to the article W placed in the heat treatment space S2 through the light transmitting window 42. As a result, the article W is heated to a specified temperature.

As semiconductor elements have recently been reduced to micron size and steadily advanced in performance, the demand for uniform temperature distribution of an article to be treated has increased more than ever.

As an example, when heating an article to 1100° C., it is required to heat the article in such a way that the temperature error is within the range of +/−1° C. In order to meet this requirement, one method is to shorten the distance between a filament lamp and the article to be treated so that the irradiance distribution can become uniform on the surface of the article.

However, even if a photo-irradiation type heat treatment apparatus is constructed in such a way that the distance between a filament lamp and the article becomes small, it has been found to be difficult to make the temperature error small on the surface of the article in practice. This is for the following reason.

In the photo-irradiation type heat treatment apparatus, filament lamps are cooled by blowing a large amount of cooling air on the surface of the filament lamps in order to prevent the surface of the filament lamps from becoming too hot. Accordingly, a light transmitting window placed on the light exit side of the filament lamps is also cooled together with the filament lamps. Specifically, in the conventional photo-irradiation type heat treatment apparatus as shown in FIG. 11, cooling air (as shown by a hollow arrow in FIG. 11) is introduced into the lamp unit accommodating space S1 from a cooling air supply passage 45 located on one side of filament lamps 51 in the array direction flows along a light transmitting window 42 and is discharged from a discharge air passage 46, whereby the temperature of cooling air is high on the downwind side and low on the upwind side. As a result, the light transmitting window 42 shows a temperature distribution dependent on the direction of passing cooling air (i.e., a temperature distribution in which temperature is low on the upwind side and high on the downwind side).

Moreover, since the light transmitting window is usually made larger than the effective irradiation area of the lamps, light emitted from the lamps irradiates over a larger area at the peripheral portions of the light transmitting window. As a result, a temperature distribution is such that temperature is high at the central area and low at the peripheral portions. In consequence, a temperature distribution of the light transmitting window has a distorted form by a combination of a temperature distribution dependent on the passing direction of cooling air and a temperature distribution dependent on radiation intensity. Moreover, various changes under the influence of the volume of cooling air and the fluctuation of the illuminance of lamps also affects the temperature distribution.

Thus, in the conventional photo-irradiation type heat treatment apparatus in which a light transmitting window and an article to be treated are placed close to each other, it is difficult to control the temperature of the light transmitting window, which is believed to lead to a lack of uniformity in the temperature distribution of the article under the adverse influence of a temperature distribution of the light transmitting window. On the other hand, another photo-irradiation type heat treatment apparatus has been disclosed, wherein an opening is provided on a reflecting mirror placed above multiple filament lamps and cooling air is flowed in through this opening in the direction of the normal line of the virtual plane formed by the filament lamps (See Japanese Unexamined Patent Publication No. 2000-306857 and corresponding U.S. Pat. No. 6,414,279).

It is said that the problems in obtaining a uniform temperature distribution of an article to be treated under the influence of a temperature distribution of the light transmitting window can be solved even if the light transmitting window and the article are placed close to each other. However, the simple provision of an opening on a reflecting mirror causes a problem that the radiation intensity of an article to be treated declines because the area of the effective reflecting surface of the reflecting mirror decreases to the point that the original function of the reflecting mirror is impaired.

SUMMARY OF THE INVENTION

In view of the foregoing, the present invention has a primary object to provide a photo-irradiation type heat treatment apparatus that eliminates the adverse influence of a temperature distribution of a light transmitting window on a temperature distribution of an article to be treated without losing the original function of a reflecting mirror, and therefore, heat treating the article with a desired temperature distribution in the structure in which light emitted from filament lamps irradiates the article through the light transmitting window and a cooling mechanism is provided such that cooling air is supplied or discharged to the filament lamps through an opening formed on the reflecting mirror.

The photo-irradiation type heat treatment apparatus according to the present invention allows heat treating an article to be treated by irradiating the article with light emitted from multiple filament lamps through a light transmitting window and comprises a lamp unit constituted of the multiple filament lamps constituting a planar array light source and a reflecting mirror, which reflects the light emitted from said filament lamps to the article to be treated, and a cooling air supplying mechanism, which supplies cooling air to cool the filament lamps, wherein the reflecting mirror is provided with an opening at its central area so that cooling air can pass therethrough and wherein a reflector having air permeability is provided in such a way as to cover the opening.

In the photo-irradiation type heat treatment apparatus according to the present invention, the aforementioned reflector is preferably constituted of burned ceramic particles or sintered metal particles.

In the photo-irradiation type heat treatment apparatus according to the present invention, the light transmitting window can be cooled in such a way as to have, for example, a concentric temperature distribution on its surface by cooling air introduced or discharged from an opening provided on a reflecting mirror through a reflector having air permeability, which allows controlling zones in such a way as to have a concentric temperature distribution corresponding to a temperature distribution on the surface of an article to be treated, thereby eliminating the influence of a temperature distribution of the light transmitting window on a temperature distribution made by irradiation from a lamp unit. Moreover, since a large portion of light emitted toward the reflector can be reflected toward the light transmitting window, a high level of spectral reflectivity can be maintained, which allows heat treating the article at a desired temperature distribution.

DETAILED DESCRIPTION OF THE INVENTION

Figure 1:
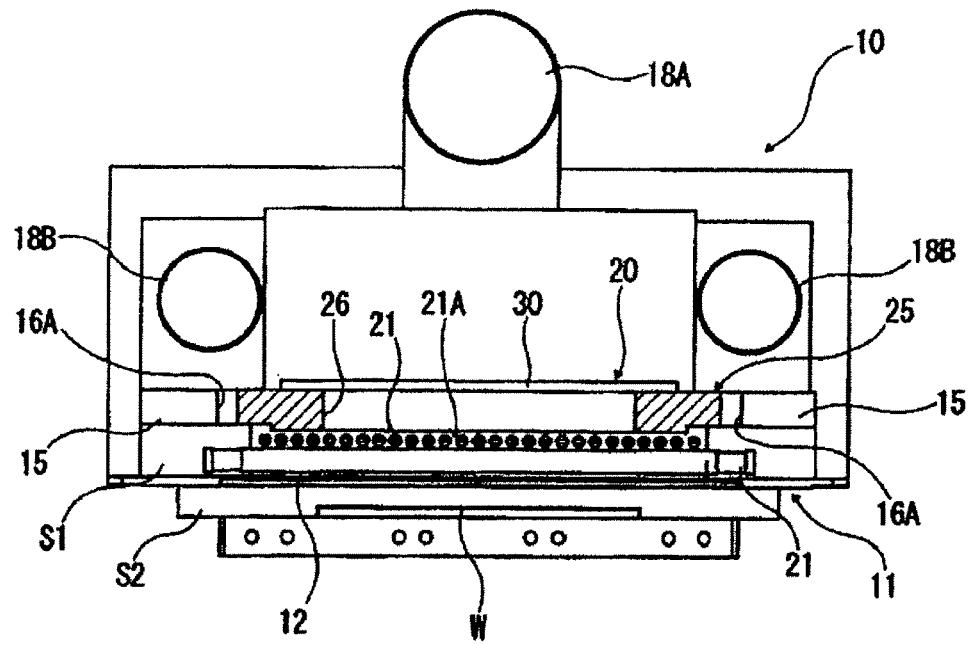
FIG. 1 is a front sectional view showing a schematic configuration of one example of the photo-irradiation type heat treatment apparatus according to the present invention.
Figure 2:
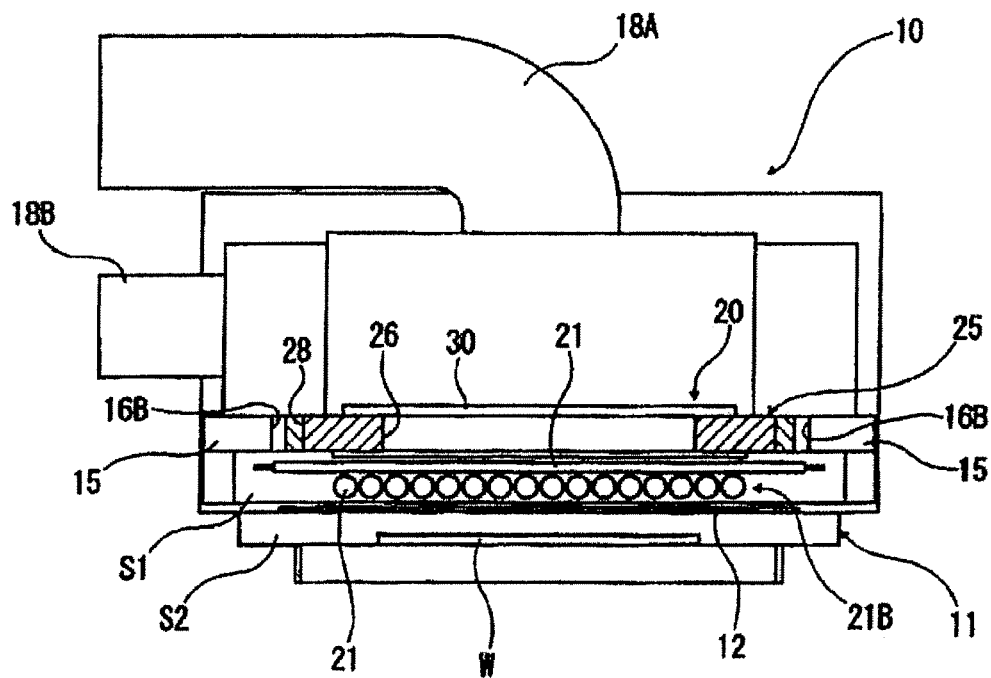
FIG. 2 is side sectional view of the photo-irradiation type heat treatment apparatus of FIG. 1.

FIG. 1 is a front sectional view showing a schematic configuration of one example of the photo-irradiation type heat treatment apparatus according to the present invention. FIG. 2 is a side sectional view of the photo-irradiation type heat treatment apparatus in FIG. 1.

A photo-irradiation type heat treatment apparatus 10 is provided with a chamber 11 made of a metallic material, such as stainless steel, and its inner space is divided into an upper lamp unit accommodating space S1 and a lower heat treatment space S2 by a disk-shaped light transmitting window 12. The lamp unit accommodating space S1 comprises a lamp unit 20 comprised of multiple filament lamps 21 and a reflecting mirror 25 arranged above the filament lamps 21 in such a way as to reflect light emitted upward from the filament lamps 21 back toward an article W to be treated, whereby light emitted from each filament lamp 51 is directly, or after being reflected by the reflecting mirror 25, delivered through the light transmitting window 12 to the article W, such as a semiconductor wafer, placed in the heat treatment space S2.

Figure 3:
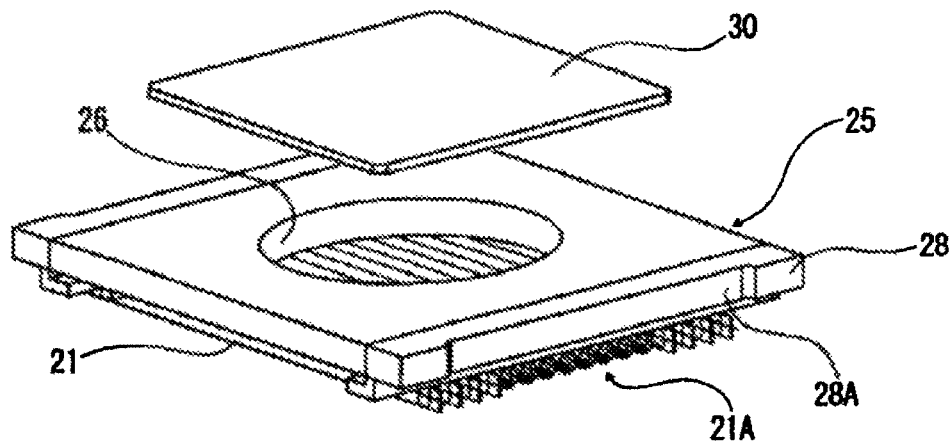
FIGS. 3(A) to 3(C) are explanatory views showing, respectively, the configuration of a lamp unit in an exploded perspective view, a perspective view showing the unit provided with a reflector and a sectional view along the central axis of a filament lamp.
Figure 3:
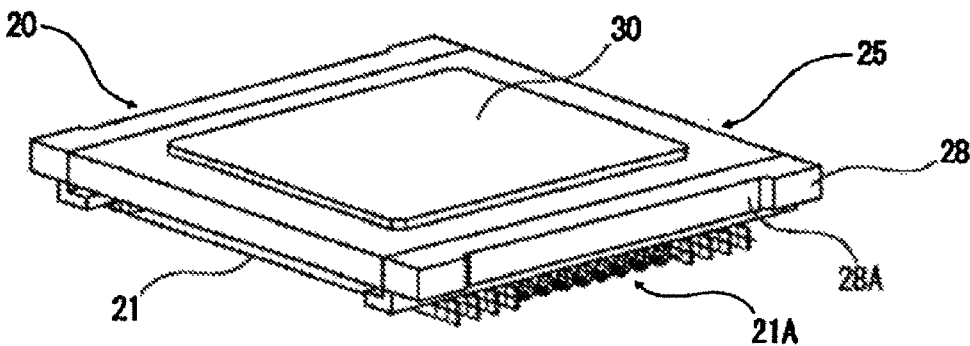
Figure 3:
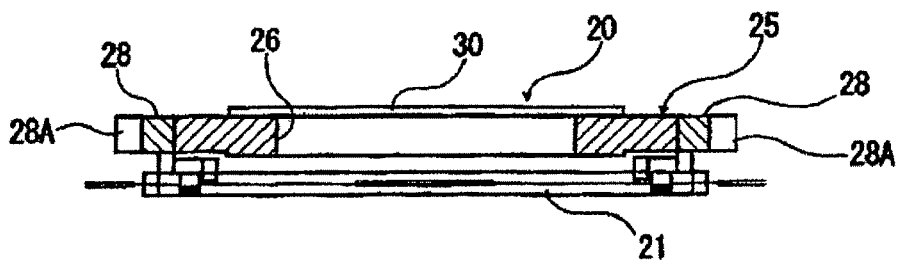

In the lamp unit 20, as shown in FIGS. 1 & 2, two lamp groups 21A and 21B are arranged vertically one above the other, wherein multiple rod-shaped filament lamps 21 of each group are arranged at specified intervals in such a way that their central axes are placed on the same plane. As shown in FIGS. 3(A)-3(C), the lamps are supported by a supporting member 28 provided on the reflecting mirror 25 in such a way that the central axes of the lamps 21 of the lamp group 21A cross with the central axes of the lamps 21 of the other lamp group 21B, whereby a planar array light source is constituted. In FIGS. 3(A)-3(C), only the lamp group 21A is shown.

The reflecting mirror 25 of the lamp unit 20 is made of, for example, plate-shaped aluminum that can be gold plated on its reflective surface as the need arises. On its central area, a circular opening 26 is formed to pass cooling air and a second plate-shaped reflector 30 having air permeability is provided so as to cover the opening 26 on the back side. The size of the opening 26 is preferably equal to or more than that of an article to be treated (diameter of a wafer).

Figure 4:
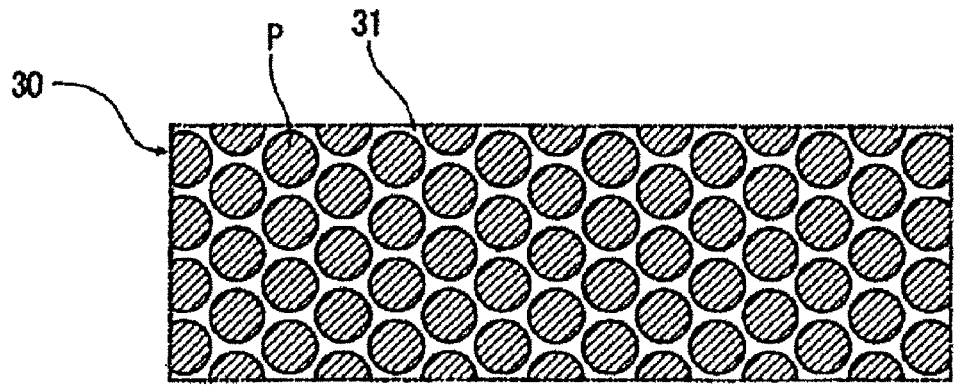
FIG. 4 is schematic sectional view showing the construction of a reflector.

The reflector 30 is formed of sintered metal particles, such as aluminum particles, burned ceramic particles made of alumina, silicone oxide or a mixture thereof or copper foam. As shown in FIG. 4, the structure of reflector 30 is such that cooling air can pass through gaps 31 formed in the interstices of the metal or ceramic particles P.

The surface of the reflector 30 may be gold plated as the need arises. The degree of porosity (i.e., the area ratio of holes converted into one hole) of the reflector 30 is preferably 30% to 70%.

The spectral reflectivity of the reflector 30 is preferably not less than 70% in the wavelength range of 400 to 1700 nm.

The lamp unit 20 is fixed by the peripheral portions of a reflecting mirror that come into contact with the inner circumference of a rectangular frame-shaped reflecting mirror support 15 used for supporting the reflector inside of chamber 11. On both sides of the lamp group 21A in the array direction are formed slit-shaped cooling air passages 16A between the reflecting mirror 25 and the reflecting mirror support 15. On both sides of the lamps 21 of the lamp group 21A in the axial direction are formed slit-shaped cooling passages 16B between convexes 28A formed on a supporting member 28 and the reflecting mirror support 15.

Here, the distance of the lamp unit 20, and more specifically, the distance between the other lamp group 21B and a light transmitting window 12 is in the range of about 3 to 20 mm, for example.

The light transmitting window 12 is disc-shaped and made of material such as quartz glass that is transmittable to light emitted from filament lamps 21.

The light transmitting window 12 is approximately 3 to 25 mm in thickness and 400 to 600 mm in diameter.

Above the chamber 11 is provided a cooling air supply mechanism for supplying cooling air to cool the filament lamps 21. In FIGS. 1 & 2 ducts 18A, 18B of the cooling air passages are shown.

The cooling air supply source (e.g., a fan) in the cooling air supply mechanism may either blow out air or suck in air so that cooling air can flow, or be discharged, into the lamp unit accommodating space S1 through the opening 26 of the reflecting mirror 25.

In the aforementioned photo-irradiation type heat treatment apparatus 10, properly controlled power is supplied to each filament lamp 21 of the lamp unit 20, whereby light emitted from each filament lamp 21 is directly or after being reflected by the reflecting mirror 25 delivered to the article W to be treated in the heat treatment space S2 through the light transmitting window 12 in order to heat treat the article W.

At a time when the article W is heat treated, the article W is divided into multiple zones, for example, and the lighting of each filament lamp 21 is put under control so that a temperature distribution suitable for physical characteristics of the article W can be achieved for each zone.

At the same time each filament lamp 21 is lit, cooling air is supplied to the lamp unit accommodating space S1 from the cooling air supply mechanism. Here, the volume of cooling air to be supplied is in the range of 3 to 10 m$^3$/min.

A description of the major flow of cooling air is given below. The cooling air supplied from a duct 18A is introduced into the lamp unit accommodating space S1 through the reflector 30 and the opening of the reflecting mirror 25 and is blown toward each filament lamp 21 so that the bulb of each filament lamp 21 can be cooled. The air then passes through filament lamps 21 and is blown toward the light transmitting window 12. The cooling air heated by heat exchange flows along the light transmitting window 12, spreads radially toward the peripheral portions of the light transmitting window 12 from its central area and then is discharged to the outside from four slit-shaped cooling air passages 16A, 16B formed on the peripheral portions (four places) of the reflecting mirrors 25 through the duct 18B.

The direction of the flow of cooling air is not limited to the above example. The configuration may be such that the cooling air supplied from the duct 18B is introduced into four slit-shaped cooling air passages 16A, 16B formed on the peripheral portions (four places) of the reflecting mirrors 25, passes through the opening 26 of the reflector 30 and the reflecting mirror 25 and then is discharged to the outside from the duct 18A. In this case, the cooling air flows toward the central area of the light transmitting window 12 from its peripheral portions.

Thus, in the photo-irradiation type heat treatment apparatus 10, the opening 26 is formed at the central area of the reflecting mirror 25 and the reflector 30 having air permeability provided in such a way as to cover the opening 26. Cooling air is supplied to the filament lamps 21 through the opening 26. The light transmitting window 12 to be cooled together with the filament lamps 21 can therefore be cooled in such a way as to have a concentric temperature distribution on its surface, which allows controlling zones in such a way as to have a concentric temperature distribution corresponding to a temperature distribution on the surface of an article W to be treated, thereby eliminating the adverse influence of a temperature distribution of the light transmitting window 12 on a temperature distribution made by irradiation from a lamp unit 20. Moreover, since the reflector 30 is made of burned ceramic particles or sintered metal particles, light introduced into the reflector 30 is dispersed and multi-reflected among the metal particles or ceramic particles and a large portion of the light emitted toward the reflector 30 can be reflected back toward the light transmitting window 12. As a result, even if the structure of the opening of the reflecting mirror 25 is such that the degree of porosity is 50%, for example, the reflecting mirror 25 can maintain its original function (i.e., the spectral reflectivity can be maintained at a high level (e.g., approximately 90%)) in to use of the opening as described in U.S. Pat. No. 6,414,279, where light incident on the opening passes toward the rear side of the reflecting mirror only to be lost, resulting in the reflectivity becoming equal to the occupied space ratio of the opening (i.e., the degree of porosity), meaning that the reflectivity declines to approximately 50%.

Accordingly, the present invention allows heat-treating of the article W to be performed with a desired temperature distribution.

A description of tests that were carried out to confirm the effects of the present invention is given below.

TEST 1 (INVENTIVE EXAMPLE)

Figure 5:
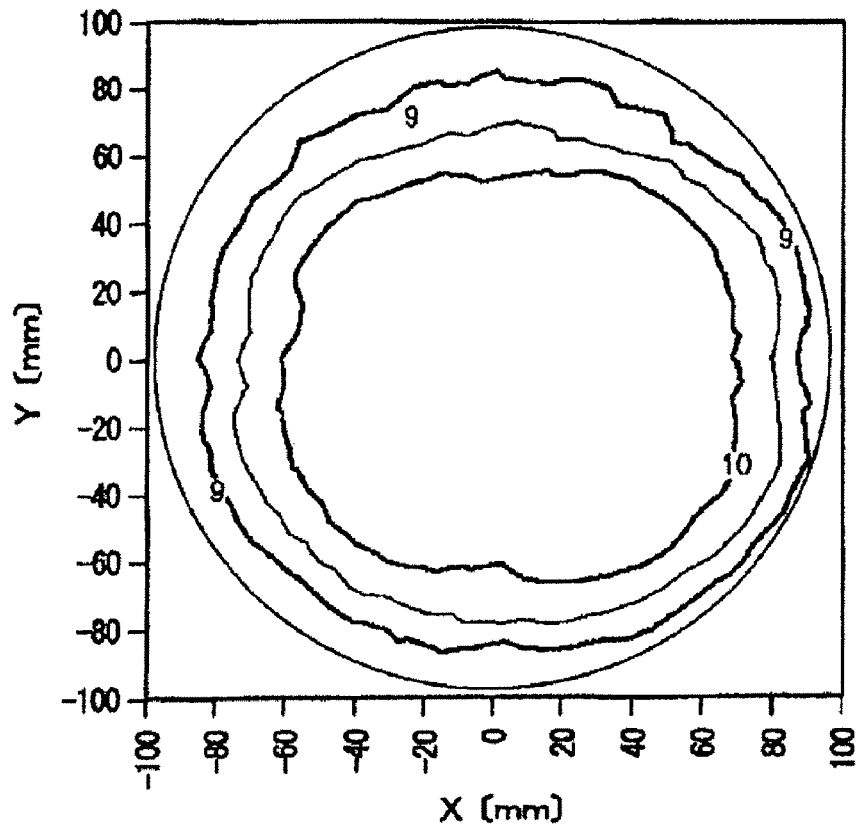
FIG. 5 is a diagram showing the film thickness distribution of a silicone oxide film formed on an article to be treated using the photo-irradiation type heat treatment apparatus according to the present invention.
Figure 6:
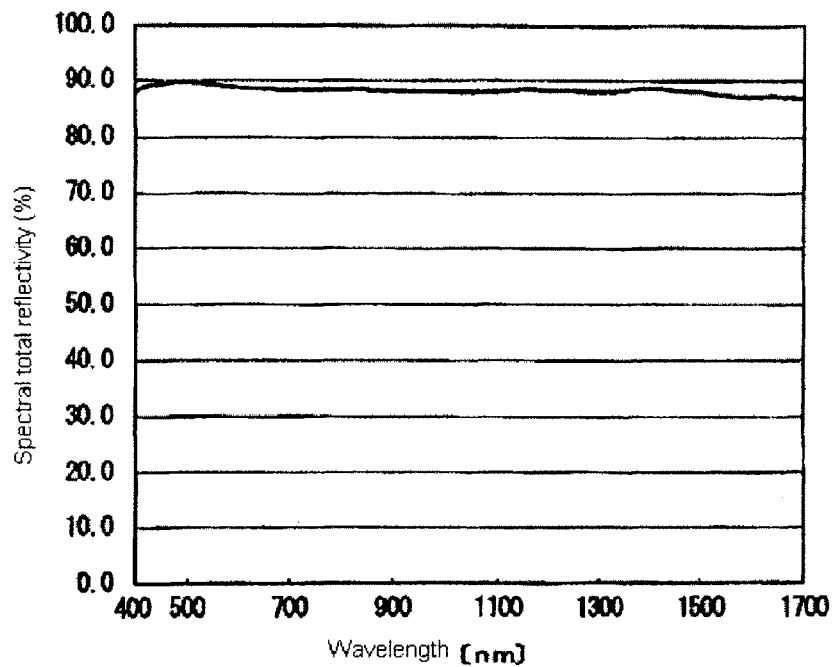
FIG. 6 is graph showing the measured results of the spectral total reflectivity of a reflector used in the present embodiment.

Heat treatment was performed to produce a silicone oxide film on the surface of silicone wafer of 200 mm in diameter under the conditions as shown below using the photo-irradiation heat treatment apparatus according to the present invention that has a configuration as set forth below and had been made according to the configuration as shown in FIG. 1 and the film thickness distribution of the silicone oxide film formed on the silicone wafer measured. FIG. 5 shows the results. The numeric values in FIG. 5 show film thickness in nm.

Photoirradiation Type Heat Treatment Apparatus

The lamp unit 40 had 27 lamps. The pitch of the lamps was 15 mm. Each lamp was 80 W/cm in power density, 40 cm in light emission length, 200 V in rated voltage and 320 W in rated power.

The reflecting mirror was 425 mm long×425 mm wide. The size of the opening for the cooling air passages was 200 mm in diameter. The reflector was 230 mm long×230 mm wide, made of a porous material whose major substance was alumina ceramic manufactured by Mitsubishi Mining Material KK with a 50% degree of porosity and a high spectral reflectivity in the wavelength range of 400 to 700 nm.

The light transmitting window was 5 mm in thickness and 420 mm in diameter.

The distance between the lamp unit and the article to be treated was 100 mm. The distance between the lamp unit and the light transmitting window was 35 mm. The distance between the light transmitting window and an article to be treated was 60 mm.

All the filament lamps were operated under the same lighting conditions. The volume of cooling air was 5 m$^3$/min.

Oxidation Conditions

Pure oxygen was used as a processing gas. The flow rate of the processing gas was 5 liters/min. The temperature to heat the silicone wafer was set to 1100° C. under atmospheric pressure.

In the photo-irradiation type heat treatment apparatus according to the present invention, as shown in FIG. 5, the film thickness distribution of the silicone oxide film was substantially concentric, wherein the silicone oxide film was thicker in the central zone of the article than the peripheral zones thereof. The temperature distribution on the surface of the article was substantially concentric, wherein the temperature was higher in the central zone of the article than that in the peripheral zones thereof. We believe that this is because the light transmitting window was cooled by cooling air introduced from the opening provided on the reflecting mirror through the reflector and had a concentric temperature distribution, resulting in a concentric temperature distribution of the article to be treated.

Accordingly, the temperature distribution on the surface of an article to be treated can be adjusted to a uniform state by making the power inputted to the filament lamps arranged for the central zone of the article lower than that input to the filament lamps arranged for the peripheral zones of the article.

TEST 2 (COMPARATIVE EXAMPLE)

Figure 7:
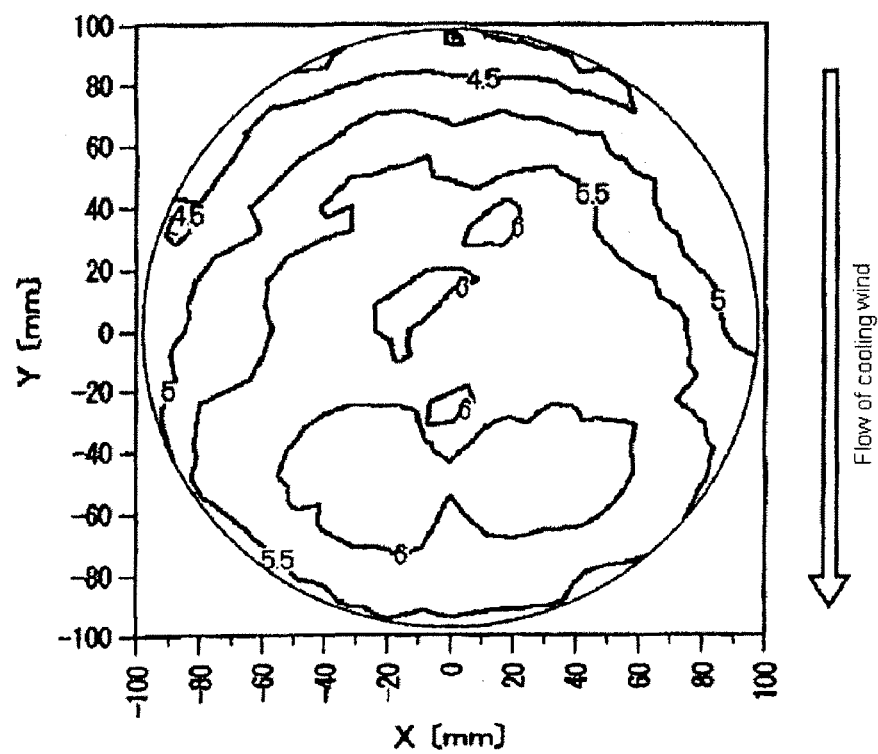
FIG. 7 is a plot of the film thickness distribution of a silicone oxide film formed on an article to be treated using a conventional photo-irradiation type heat treatment apparatus.
Figure 11:
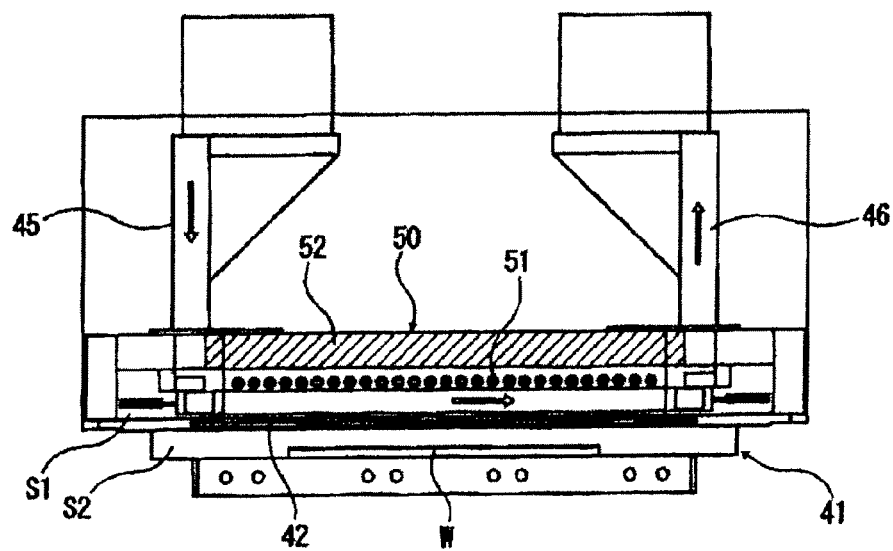
FIG. 11 is a front sectional view showing a schematic configuration of a conventional photo-irradiation type heat treatment apparatus.

We carried out heat treatment to form a silicone oxide film under the same conditions as described in Test 1 using the photo-irradiation type heat treatment apparatus made in accordance with the configuration as shown in FIG. 11. FIG. 7 shows the results. This photo-irradiation type heat treatment apparatus had the same configuration of the lamp unit and others as the aforementioned Test 1, except that the reflecting mirror had no opening and that cooling air was supplied along the light transmitting window. The numeric values in FIG. 7 show the thickness of the silicone oxide film. The arrows show the flowing direction of cooling air.

In the conventional photo-irradiation type heat treatment apparatus, as shown in FIG. 7, it was obviously difficult to make a temperature distribution substantially concentric on the surface of an article to be treated. It is believed that this is because a temperature distribution of the light transmitting window was not concentric, with the result that a temperature distribution of the article was not concentric under the influence of the temperature distribution of the light transmitting window in close proximity to the article. Accordingly, we confirmed that it was not possible to make a temperature distribution uniform on the surface of an article to be treated no matter how hard it was tried to adjust the power input to filament lamps in the conventional apparatus.

An embodiment according to the present invention has been explained above. However, the present invention is not limited to the abovementioned embodiment. Various alternations are allowed.

Figure 8:
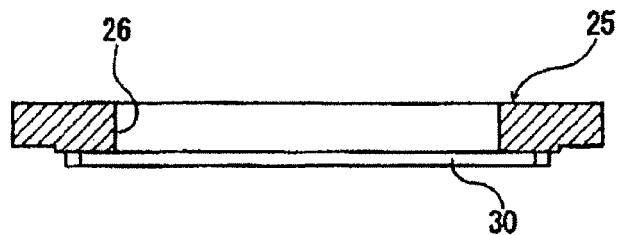
FIG. 8 is sectional view showing another configuration of a reflecting mirror for the photo-irradiation type heat treatment apparatus according to the present invention.
Figure 9:
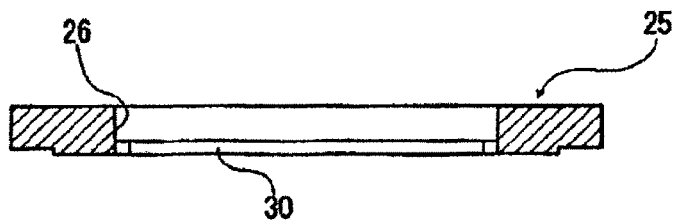
FIG. 9 is sectional view showing yet another configuration of a reflecting mirror for the photo-irradiation type heat treatment apparatus according to the present invention.
Figure 10:
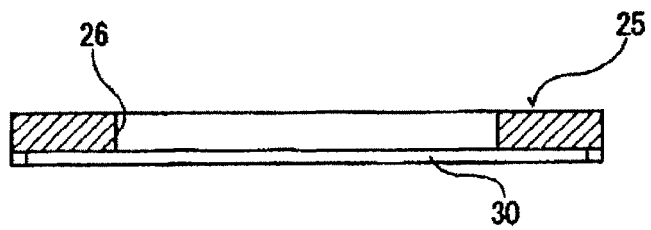
FIG. 10 is a sectional view showing a further configuration of a reflecting mirror for the photo-irradiation type heat treatment apparatus according to the present invention.

As an example, the reflecting mirror 25 is not limited to the configuration of the abovementioned embodiment. As shown in FIG. 8, it may be provided with a reflector 30 that covers the underside of an opening 26 formed at the central area. As shown in FIG. 9, it may be provided with a reflector 30 that is joined together with the rim of the opening 26 on the underside thereof formed at the central area. Moreover, as shown FIG. 10, it may be provided with a reflector 30 that covers the underside of an opening 26 formed at the central area covering the entire reflecting surface of the reflecting mirror 25. Any of those reflecting mirrors can achieve the same results as those described in the abovementioned embodiment.

Furthermore, in the photo-irradiation type heat treatment apparatus according to the present invention, the number and array method of the filament lamps constituting the lamp unit are not limited to the abovementioned embodiment but can be properly changed in accordance with the purpose.

What is claimed is:

1. A photo-irradiation type heat treatment apparatus for heat treating an article by irradiating the article with light, said apparatus comprising:
    a lamp unit having multiple filament lamps constituting a planar array light source,
    a reflecting mirror, which reflects light emitted from said filament lamps to the article to be treated,
    a light transmitting window through which light emitted from said filament lamps travels to the article to be treated,
    and a cooling air supplying mechanism which supplies cooling air to cool the filament lamps,
    wherein the reflecting mirror is provided with an opening spanning an entire central area thereof over portions of a plurality of said multiple filament lamps, and
    wherein an air permeable reflector made of an air permeable porous material is provided covering the opening in a manner permitting the cooling air to pass therethrough from the cooling air supplying mechanism to a space in which said filament lamps are located while providing the reflectivity function of the reflecting mirror within the area spanned by said opening.

2. The photo-irradiation type heat treatment apparatus according to claim 1, wherein said reflector is formed of one of burned ceramic particles and sintered metal particles.

3. The photo-irradiation type heat treatment apparatus according to claim 1, wherein the reflector has a degree of porosity in the range of about 30% to 70%.

* * * * *